United States Patent [19]
Bryant

[11] Patent Number: 6,140,745
[45] Date of Patent: Oct. 31, 2000

[54] MOTOR MOUNTING FOR PIEZOELECTRIC TRANSDUCER

[75] Inventor: Timothy D. Bryant, Gloucester, Va.

[73] Assignee: Face International Corp.

[21] Appl. No.: 09/419,338

[22] Filed: Oct. 15, 1999

Related U.S. Application Data

[60] Provisional application No. 60/104,676, Oct. 16, 1998.
[51] Int. Cl.[7] .................................................. H01L 41/08
[52] U.S. Cl. ............................................ 310/353; 348/328
[58] Field of Search ..................................... 310/348, 353, 310/354, 355

[56] References Cited

U.S. PATENT DOCUMENTS 5,973,441  10/1999  Lo et al. ................................. 310/353

*Primary Examiner*—Thomas M. Dougherty
*Attorney, Agent, or Firm*—Stephen E. Clark; David J. Bolduc

[57] ABSTRACT

A piezoelectric motor has a piezoelectric transducer disposed within a motor housing. The piezoelectric transducer is constructed of one or more piezoelectric elements, the opposite ends of which are loosely secured within recesses in the interior walls of the motor housing. Electric contact plates disposed on opposite major surfaces of each piezoelectric element hold the center portions of the piezoelectric elements in fixed relationship to each other and provide a means of conducting electical energy to the respective faces of the piezoelectric elements. A moveable piston member is attached to one of the contact plates. When an alternating voltage potential is applied across the major surfaces of the piezoelectric elements, the center portions of each of the piezoelectric elements, as well as the piston attached thereto, reciprocates within the motor housing while the ends of each of the piezoelectric elements remain secured within the recesses in the interior walls of the housing.

1 Claim, 8 Drawing Sheets

MOTOR MOUNTING FOR PIEZOELECTRIC TRANSDUCER

This application claims benefit to U.S. provisional application No. 60/104,676 filed Oct. 16, 1998.

BACKGROUND OF THE INVENTION

1. Field of Invention

The present invention generally relates to motors with piezoelectric transducer elements, and more particularly, to the electrical and mechanical mounting of a high deformation piezoelectric transducer within a motor housing.

2. Description of the Prior Art

Piezoelectric and electrostrictive materials develop a polarized electric field when placed under stress or strain. Conversely, they undergo dimensional changes in an applied electric field. The dimensional change (i.e., expansion or contraction) of a piezoelectric or electrostrictive material is a function of the applied electric field.

A typical prior ceramic device such as a direct mode actuator makes direct use of a change in the dimensions of the material, when activated, without amplification of the actual displacement. Direct mode actuators typically include a piezoelectric or electrostrictive ceramic plate sandwiched between a pair of electrodes formed on its major surfaces. The device is generally formed of a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent.

Indirect mode actuators are known in the prior art to provide greater displacement than is achievable with direct mode actuators. Indirect mode actuators achieve strain amplification via external structures. An example of an indirect mode actuator is a flextensional transducer. Prior flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater displacement than can be produced by direct mode actuators.

The magnitude of the strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10% but can only sustain loads which are less than one pound. A conventional bimorph device includes an intermediate flexible metal foil sandwiched between two piezoelectric elements. Electrodes are bonded to each of the major surfaces of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20% (i.e. about twice that of unimorphs), but, like unimorphs, typically can only sustain loads which are less than one pound.

A unimorph actuator called "THUNDER", which has improved displacement and load capabilities, has recently been developed and is disclosed in U.S. Pat. No. 5,632,841. THUNDER (which is an acronym for THin layer composite UNimorph ferroelectric Driver and sEnsoR), is a unimorph actuator in which one or more pre-stress layers are bonded to a thin piezoelectric ceramic wafer at high temperature, and during the cooling down of the composite structure asymmetrically stress biases the ceramic wafer due to the difference in thermal contraction rates of the pre-stress layers and the ceramic layer.

In operation a THUNDER actuator may be energized by an electric power supply via a pair of electrical wires which are typically soldered to the metal prestress layers or to the electroplated faces of the ceramic layer. In practice, these actuators 100 have been used to directly drive a pressure plate 8 or other mechanism in a prior art cyclic motor as shown in FIG. 3.

Typically, the convex face 100y of the actuator 100 would directly push (in the direction of arrow 7) against a plate 8 at the lowest point of its curvature, and the plate 8 would maintain contact with the actuator 100, returning to its rest position through the use of a spring mechanism 6. If multiple actuators are used, the actuators and their electrical connections were electrically isolated from each other using TEFLON™ tape (not shown).

A problem with the above described mounting method for a direct drive actuator is that the force against the actuator was concentrated on one point, or at least in a very small area of the actuator. This would cause the ceramic in the actuator or the whole actuator to break due to point load concentration. The actuator would then lose most of its effectiveness because it could not generate as much force or displacement with a cracked ceramic.

Another problem with prior art actuator mounting methods is that a single actuator typically could not generate sufficient force for higher output applications. This is especially true of applications where the pressure plate against which the actuator acted was spring mounted. The actuator dissipated a large amount of its useful force in trying to overcome the spring mechanism. The force generated for some applications would also fracture the ceramic layer of the actuator.

Another problem with prior art actuator mounting methods is that a single actuator typically could not generate sufficient displacement for higher output applications.

Another problem arose in prior applications using multiple, stacked actuators. In this application, the actuators are electrically isolated from each other using layers of TEFLON™ between the electrical connections on each actuator. The TEFLON™ also adds weight and opposes the motion of the actuator, dissipating the useful force and displacement in the stacked actuators.

Another problem with previous mounting methods for piezoelectric actuators is that wires which were soldered onto the electrode surface of the actuator would loosen and fracture as the actuator deformed. As the actuator deformed, the wire at its point of attachment would bend and eventually fracture from fatigue. The cyclic shaking motion of the actuator would also cause the soldered attachment point to loosen or fracture.

SUMMARY OF THE INVENTION

The present invention provides a mounting for a piezoelectric actuator or a stack of piezoelectric actuators, in which the mechanical and electrical mounting are secure, and dissipative losses of prior art devices are minimized. In the preferred embodiment, a stack of transducers is mounted in a clamshell configuration. Electrical contact plates provide both secure mechanical mounting and durable electrical contact, while sliding side mounts efficiently translate the force and displacement of the transducer stack.

Accordingly, it is a primary object of the present invention to provide a mounting for a piezoelectric actuator which allows for the production of the force and displacement for motor applications.

It is a further object of the present invention to provide a device of the character described in which a stack of actuators produces high force and low displacement in a drive mechanism.

It is a further object of the present invention to provide a device of the character described in which a single clamshell configuration for a stack of actuators produces moderate force and moderate displacement in a drive mechanism.

It is a further object of the present invention to provide a device of the character described in which a multiple clamshell configuration for a stack of actuators produces low force and high displacement in a drive mechanism.

It is a further object of the present invention to provide a device of the character described in which a clamshell configuration for a stack of actuators eliminates the need for spring mechanism to return a drive mechanism to a rest position.

It is a further object of the present invention to provide a device of the character described in which loads driven by the actuator are effectively distributed to avoid fracture of the ceramic element of the piezoelectric actuator.

It is a further object of the present invention to provide a device of the character described in which stacked actuators are electrically isolated from each other without adding undue weight.

It is a further object of the present invention to provide a device of the character described in which electrical conductors may be attached to an actuator without subjecting the conductors to cyclic stress and fatigue.

It is a further object of the present invention to provide a device of the character described in which multiple electrical connections to stacked actuators may be made using a minimum of conductors.

It is a further object of the present invention to provide a device of the character described in which durable electrical connections can be made simultaneously with a mechanical mounting.

It is a further object of the present invention to provide a device of the character described in which losses in force and displacement are minimized through effective coupling to a drive mechanism.

Further objects and advantages of this invention will become apparent from a consideration of the drawings and ensuing description thereof.

DESCRIPTION OF THE PREFERRED EMBODIMENTS

With reference directed toward the appended drawings, a motor using a prestressed high deformation piezoelectric transducer mounted on a flexible coupling within a motor housing and manufactured embodying the principles and concepts of the present invention will be described.

Figure 1:
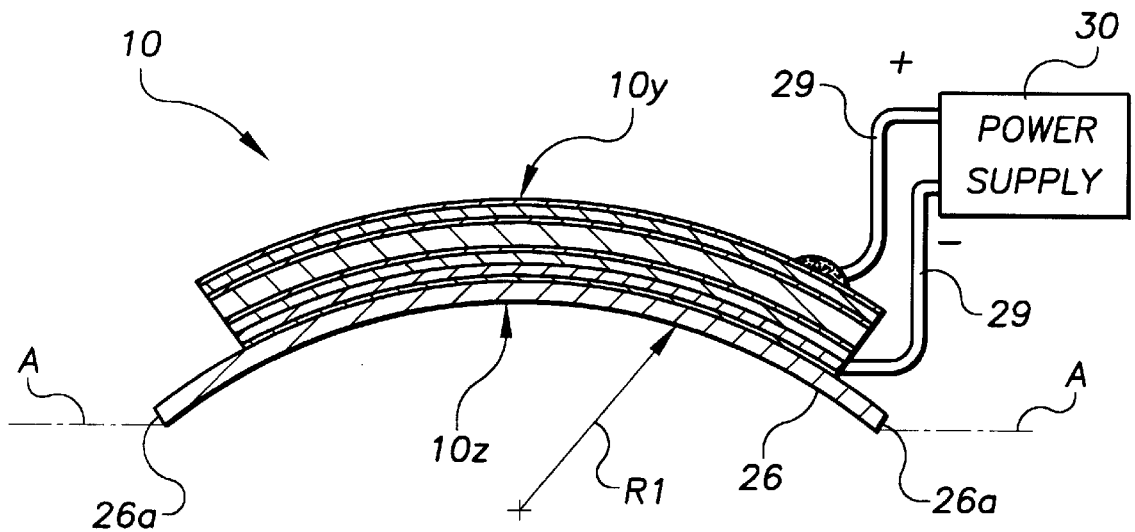
FIG. 1 is a medial cross sectional view showing a piezoelectric actuator element.
Figure 2:
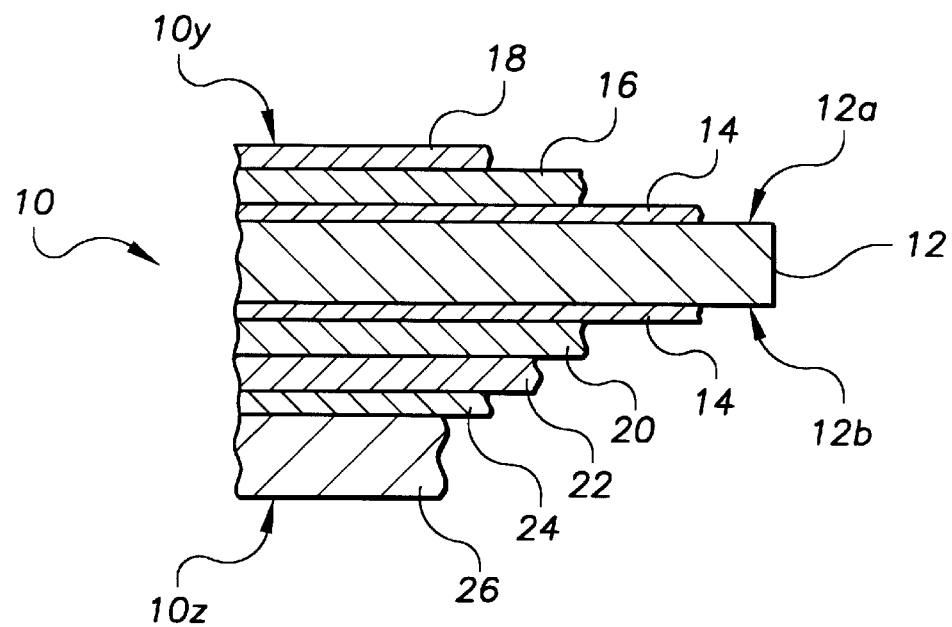
FIG. 2 is a partial cross sectional view showing the details of the composite layers of piezoelectric actuator element of FIG. 1.
Figure 3:
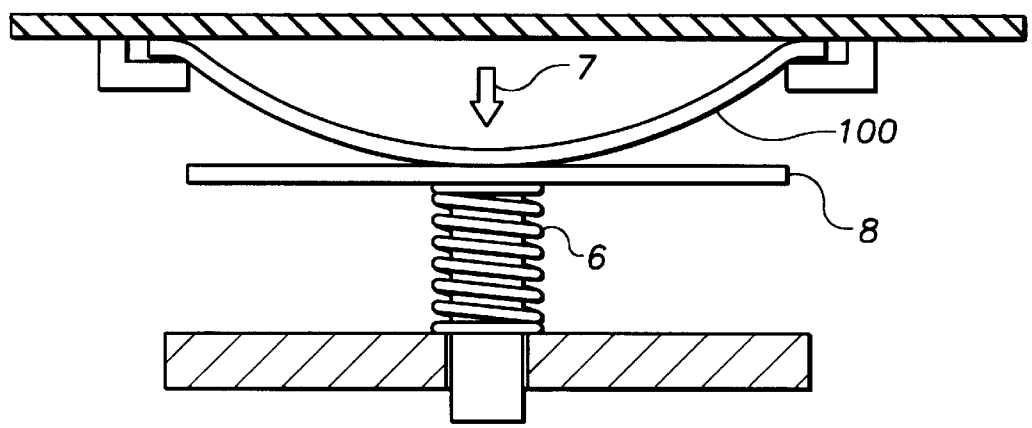
FIG. 3 is an elevational view showing a piezoelectric actuator element directly actuating a spring-mounted driver as in the prior art.

With initial reference to FIGS. 1 and 2, in the preferred embodiment of a transducer 10, an electroactive element 12 is electroplated 14 on its two major surfaces 12a and 12b. Adjacent one of the electroplated 14 surfaces of the electroactive element 12 is a first adhesive layer 16, (preferably LaRC-SI™ adhesive, as developed by NASA-Langley Research Center and commercially marketed by IMITEC, Inc. of Schenectady, N.Y.). Adjacent the first adhesive layer 16 is a first aluminum layer 18 which preferably forms the outside surface on one major face 10y of the transducer 10. A second adhesive layer 20 (also preferably LaRC-SI™ adhesive, as developed by NASA-Langley Research Center and commercially marketed by IMITEC, Inc. of Schenectady, N.Y.) is between a second aluminum layer 22 and the electroplated surface 14 on the second major surface 12b of the electroactive element 12. A third adhesive layer 24 is between the second aluminum layer 22 and a spring member 26. The electroactive element 12, first and second aluminum layers 18 and 22, and the spring member 26 may be initially disk-shaped members that form a dome shaped transducer, or they may be initially rectangular and form an arcuate transducer.

In the preferred embodiment of the invention the electroactive element 12 is a piezoelectric material such as a PZT ceramic. By way of example, in the preferred embodiment of the invention the electroactive element 12 is between 1 and 2 inches in length and 1 to 2 inches in width and has a thickness of between 0.010 and 0.050 inches; the first aluminum layer 18 has a thickness of between 0.001 and 0.010 inches; the second aluminum layer has a thickness of between 0.005 and 0.010 inches; and the spring member has a thickness of between 0.010 and 0.050 inches. The spring member 26 preferably is made of a metal of high elasticity, such as spring steel, which has a greater coefficient of thermal contraction than does the electroactive element 12. The spring member 26 may however be made of any material that has a greater coefficient of thermal contraction than does the electroactive element 12 and is preferably conductive.

During manufacture of the transducer 10 the electroactive element 12, the adhesive layers 16, 20 and 24, the two aluminum layers 18 and 22, and the spring member 26 are simultaneously heated to a temperature above the melting point of the adhesive material, and subsequently allowed to cool, thereby resolidifying and setting the adhesive layers 16 and 20 and bonding them to the adjacent layers. During the cooling process the electroactive layer 12 becomes compressively stressed due to the relatively higher coefficients of thermal contraction of the materials of construction of the two aluminum layers 18 and 22 and the spring member 26 than for the material of the electroactive element 12. Also, due to the greater coefficient of thermal contraction of the combined laminate materials (e.g. second aluminum layer 22, the second and third adhesive layers 20 and 24, and the spring member 26) on one side of the electroactive element 12 than the laminate materials (e.g. the first adhesive layer 16 and the first aluminum layer 18) on the other side of the electroactive element 12, the laminated structure deforms into a normally arcuate shape such that the outer surface 10z of the transducer on one side of the transducer 10 is concave and the outer surface 10y on the other side of the transducer 10 is convex, as illustrated in FIG. 1. In certain embodiments of the invention single adhesive layer applied to only one side of the electroactive element 12, in conjunction with the heating of the adhesive and cooling of both the adhesive and electroactive element 12 may be sufficient to compressively stress the electroactive element 12. Thus it is within the scope of the present invention to use a combination of adhesives with or without the other laminate layers (first and second aluminum layers and spring member) or with additional laminate layers to compressively stress the electroactive element 12.

Although the first and second aluminum layers 18 and 22 provide some pre-stressing to the electroactive element 12, the principal function of those layers is to provide an electrically conductive material by which the electrical energy may be applied uniformly to the electroplated surfaces 14 of the electroactive element 12. In some instances the adhesive layers may comprise electrically insulating materials, in which cases it is advantageous to roughen the faces of the aluminum layers 18 and 22 which face the respective electroplated surfaces 14 so as to facilitate and maintain physical and electrical contact between the aluminum layers and the electroplated surfaces. The faces of the spring member 26 and the aluminum layer 22 facing each other may also be roughened to facilitate and maintain physical and electrical contact between the aluminum layer 22 and the spring member 26.

In the preferred embodiment of the invention the electroactive element 12 is poled in one direction. More specifically, in the preferred embodiment of the invention, the electroactive element 12 is poled in a thickness direction, such that when a voltage potential is applied across the electroplated surfaces 14 on its respective major faces 12a and 12b the electroactive element 12 longitudinally strains.

After the transducer 10 has been constructed in accordance with the foregoing process, the transducer 10 normally assumes an arcuate shape having an exposed concave surface 10z formed by the spring member 26 and an exposed convex surface 10y formed by the first aluminum layer 18. If no voltage is applied to the two electroplated surfaces 14 of the electroactive element 12 the transducer is biased to remain in this configuration/shape (i.e. having a concave face 10z on the exposed surface of the spring member 26 and an convex face 10y on the exposed surface of the first aluminum layer 18) as illustrated in FIG. 1.

If a relatively small voltage is applied to the two electroplated surfaces 14 of the electroactive element 12, the electroactive element 12 will piezoelectrically expand or contract in a direction perpendicular to its opposing major faces 12a and 12b, depending on the polarity of the voltage being applied. Because of the relatively greater combined tensile strength of the laminate layers (i.e. the second aluminum layer 22, the second and third adhesive layers, and the spring member 26) bonded to one side of the electroactive element 12 than on the other (i.e. the first adhesive layer 16 and the first aluminum layer 18), piezoelectric longitudinal expansion of the electroactive element 12 causes the radius of the curvature R1 of the transducer 10 to become smaller. Conversely longitudinal contraction of the electroactive element 12 causes the transducer 10 to flatten out (i.e. the radius of curvature R1 of the transducer 10 becomes larger). Thus it will be understood that the radius of curvature R1 of the transducer 10 can be slightly increased or decreased (depending on the polarity of the applied voltage) by applying a small voltage to the transducer 10 from a power supply 30.

Figure 4:
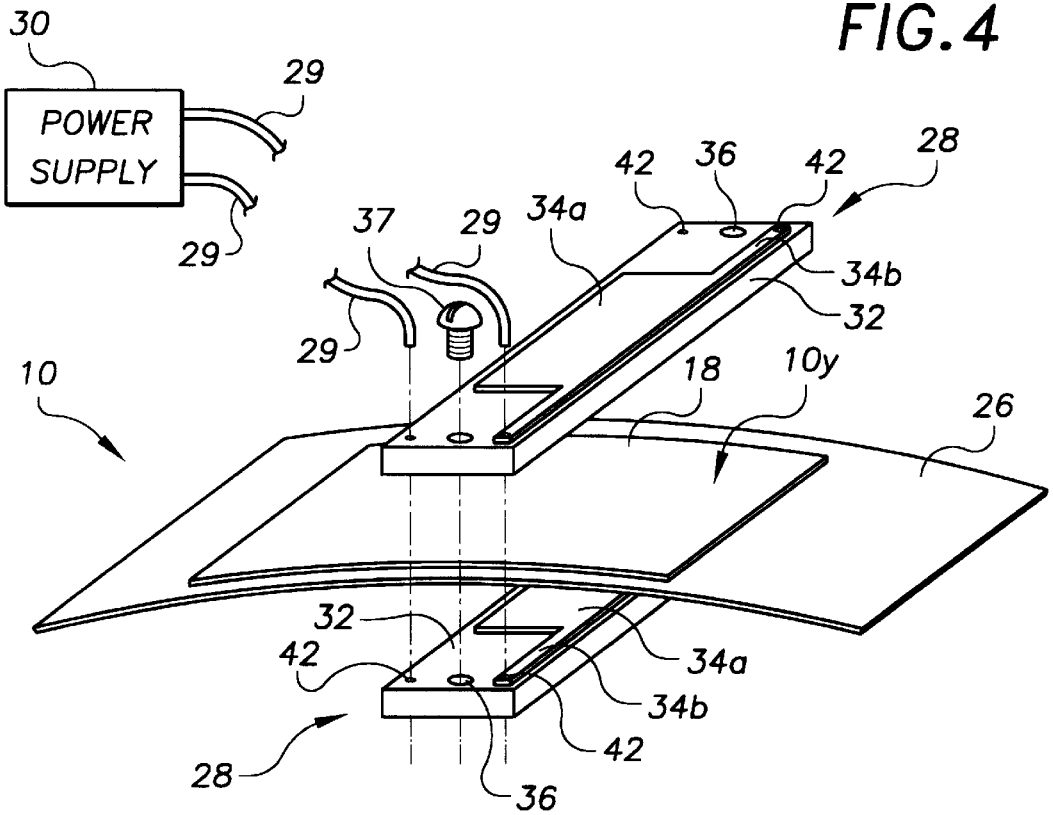
FIG. 4 is an exploded view of a piezoelectric actuator element mounted between two electrical contact plates in accordance with the preferred embodiment of the present invention.
Figure 5:
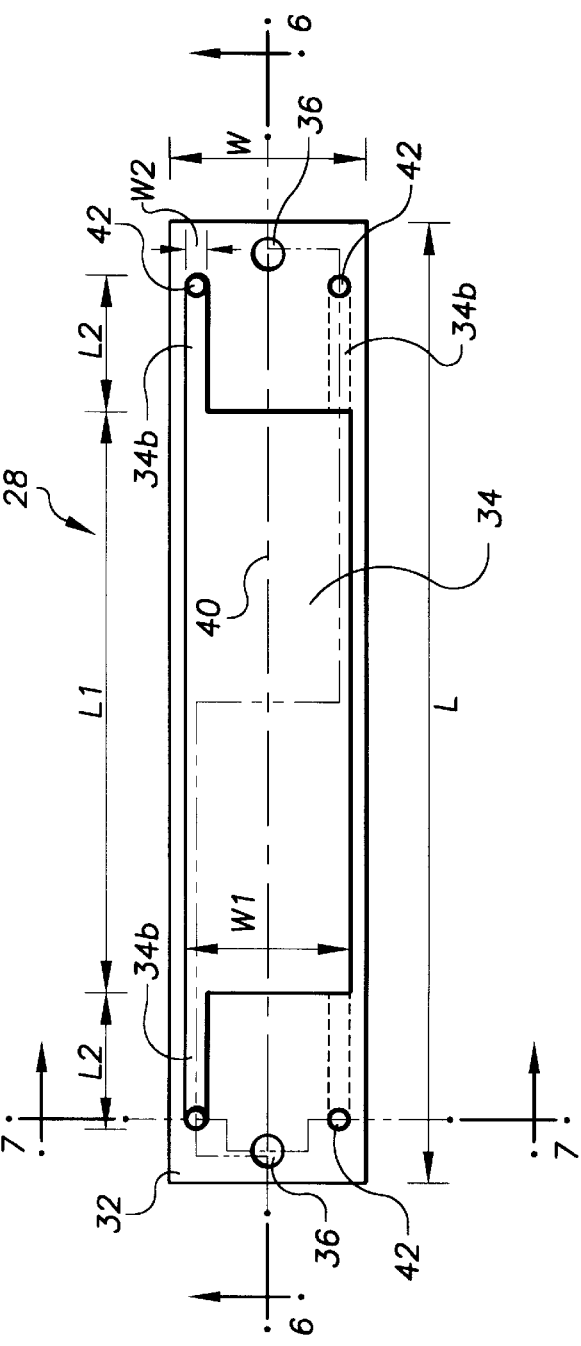
FIG. 5 is a plan view of an electrical contact plate used for electrical and mechanical mounting of the piezoelectric actuator element in FIG. 4 and in FIGS. 8–13.
Figure 6:
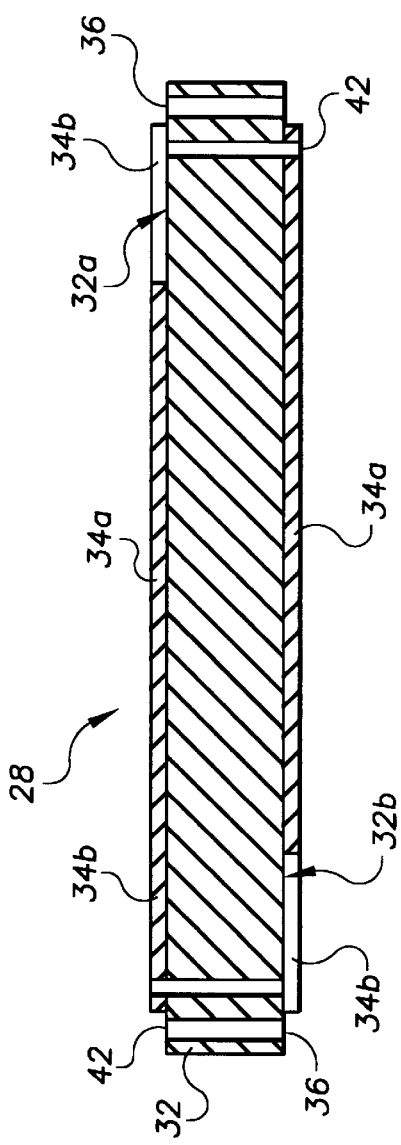
FIG. 6 is a cross-sectional view of the contact plate taken along line 6—6 of FIG. 5.
Figure 7A:
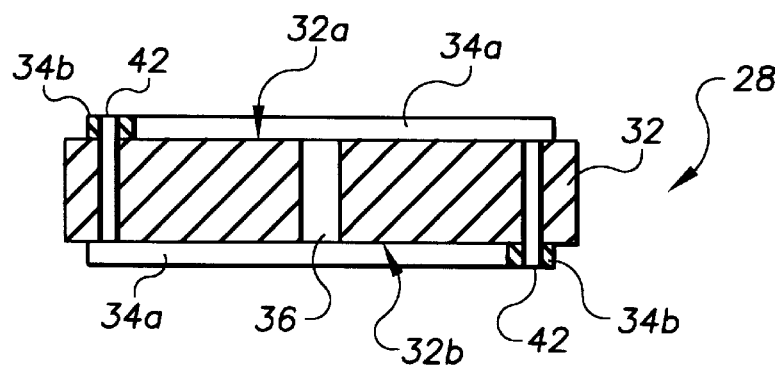
FIGS. 7A, 7B and 7C are cross sectional views taken along line 7—7 of FIG. 5, showing alternative embodiments for the profile of the conductors on the faces of the contact plate.
Figure 7B:
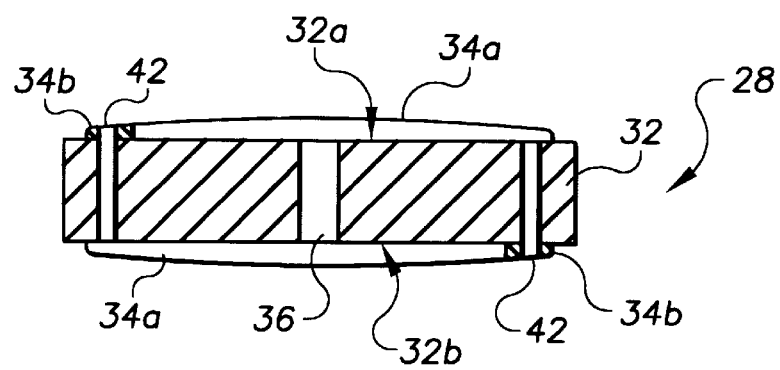
Figure 7C:
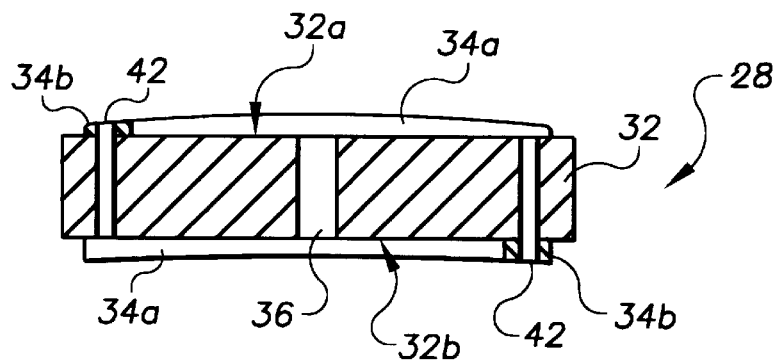

Referring now to FIGS. 4 through 6: The necessary voltage to be supplied to the transducer 10 may be applied to the first aluminum layer 18 and the spring member 26 via electrical contact plates 28. A power supply 30 is electrically connected to the transducer 10 via wires 29 which are connected to the electrical contact plates 28. The wires 29 may be connected to the electrical contact plates 28 by soldering, screws or other secure means. The electrical contact plate 28 comprises a strip 32 of insulating material such as plastic, fiberglass or other insulative materials which are conventionally used in circuit boards. On opposing face 32a and 32b of the strip 32 are conductors 34 which are adapted to contact faces 10y and 10z, respectively, of the transducer 10 and facilitate attachment of wires 29. The conductor 34 is a conductive material which may be copper, aluminum, a conductive rubber or the like. The conductor 34 has a contact portion 34a and wire attachment portions 34b. The contact portion 34a of conductor 34 is located in the center portion of the face 32a or 32b of the insulative strip 32 to which it is attached, and the contact portion 34a of the conductor 34 has a width W1 that substantially covers the width W of the strip 32. The length L1 of the contact portion 34a of the conductor 34 is no longer than the width of the exposed faces 10y and 10z of the transducer 10. The contact portion 34a of the conductor 34 is nominally flat (as illustrated in FIG. 7A), but the contact portion 34a of the conductor 34 may also be concave or convex as illustrated in FIGS. 7B and 7C. The electrical contact plates 28 of FIGS. 5, 6 and 7A may conform closely to the corresponding exposed faces 10y and 10z of a transducer 10 that is "sandwiched" between two contact plates 28 as shown in FIG. 4. The electrical contact plates 28 of FIGS. 7B (convex-convex) and 7C (convex-concave) may conform even more closely to the corresponding exposed faces 10y and 10z of transduced 10 than a flat conductor 34 of FIG. 7A when the transducer 10 deforms and becomes more concave. A concave conductor 34 may be formed from a solder bump or by molding or the like, but may also be a conductive rubber (or other elastomer), which conforms even more closely than a metal conductor when the transducer 10 undergoes a deformation.

Alternatively, the electrical contact plates 28 may be laminated into a slightly arcuate shape along their length L. The contact portions 34a of conductors 34 on two curved contact plates 28 secured together with a transducer 10 between them, exert a slightly higher pressure to the center of the transducer 10 than do the contact portions 34a of the conductors 34 on two flat electrical contact plates 28 secured together with a transducer 10 between them. A curved shape also helps avoid the natural bending (i.e. as the ends of two normally flat electrical contact plates 28 are secured together with a transducer 10 between them, the centers of the contact plates 28 bow away from the transducer 10) that occurs when two flat electrical contact plates 28 are clamped or tightened together with a transducer 10 between them.

As illustrated in FIG. 5, the conductor 34 also has wire attachment portions 34b. The wire attachment portions 34b extend from the contact portion 34a of the conductor toward opposite ends of the insulative strip 32. The wire attachment portions 34b have a width W2 narrower than the width W1 of the contact portion 34a of the conductor 34. The wire attachment portions 34b are offset from the longitudinal center line 40 of the face 32a and 32b of the insulative strip 32 to accommodate stacking of electrical contact plates 28, without shorting the electrical connections. On opposing faces 32a and 32b of the insulative strip 32, the wire attachment portion 34b on one end of the insulative strip 32 is offset from the longitudinal center line 40 to one side of the insulative strip 32 and the remaining wire attachment portion 34b on the other end is offset from the longitudinal center line 40 to the same side. However, the wire attachment portions 34b on one end but different faces 32a and 32b of the insulative strip 32 are offset from longitudinal center line 40 to different sides of the insulative strip 32.

At the end of each wire attachment portion 34b of the conductor 34, is a wire insertion hole 42 which runs perpendicularly from one face 32a to the opposite face 32b through the insulative strip 32 as shown in FIGS. 6 and 7A–7C. The walls of the wire insertion holes 42 may also be coated with a conductive coating 80 to facilitate electrical contact from the wire 29 to the wire attachment portion 34b of the conductor 34.

Wires 29 may be inserted through the wire insertion holes 42 of one or more electrical contact plates 28, and then soldered into place, thereby providing a voltage to the conductor 34 corresponding with the wire insertion hole 42 of the wire attachment portion 34b through which the wire 29 is inserted. Electrical contact plates 28 with conductors 34 configured with a contact portion 34a and wire attachment portions 34b as disclosed may be secured to each face 10y and 10z of the transducer 10.

A screw hole 36 may be provided at each end of the electrical contact plate 28 in order to stack the plates 28 and secure them (with screw 37) to each other with the transducer 10 between the electrical contact plates 28. Electrical contact plates 28 thus secured to each other provide conductive contact portions 34a in electrical contact with corresponding faces 10y and 10z of the transducer 10. Wires 29 running from a voltage source 30 are connected to the wire attachment portions 34b through the wire insertion holes 42 of the electrical contact plates 28 to provide a voltage potential across opposite faces of each transducer 10. It will be understood that several contact plate-transducer-contact plate subassemblies may be stacked upon one another (as shown in FIG. 8) and wired as described above to provide a voltage potential across the opposite faces of each of a plurality of transducers 10.

It will also be understood that the configuration of the conductors 34 on the electrical contact plates 28 prevents short-circuiting between conductors 34. Because the electrical contact portion 34a of the conductor 34 is not longer than the transducer 10, electrical contact portions 34a of one conductor will not come into contact with a facing conductor 34. Also, because the wire attachment portions 34b of facing stacked electrical contact plates 28 are off-center to different sides of their faces 32a and 32b, a short circuit will not occur between wire attachment portions of the conductor 34.

A pair of electrical contact plates 28 may be used to apply a voltage across a single transducer 10 as illustrated in FIG. 4, and three or more electrical contact plates 28 may also be used to provide electrical contact to more than one transducer 10 as shown in FIGS. 8 and 10–13. Because there is a conductor 34 on each side of the electrical contact plate 28, by alternately stacking contact plates 28 and transducers 10, the transducers 10 are simultaneously spaced apart from each other (preventing a short circuit) and provided with means for applying a voltage across each transducer 10.

Figure 8:
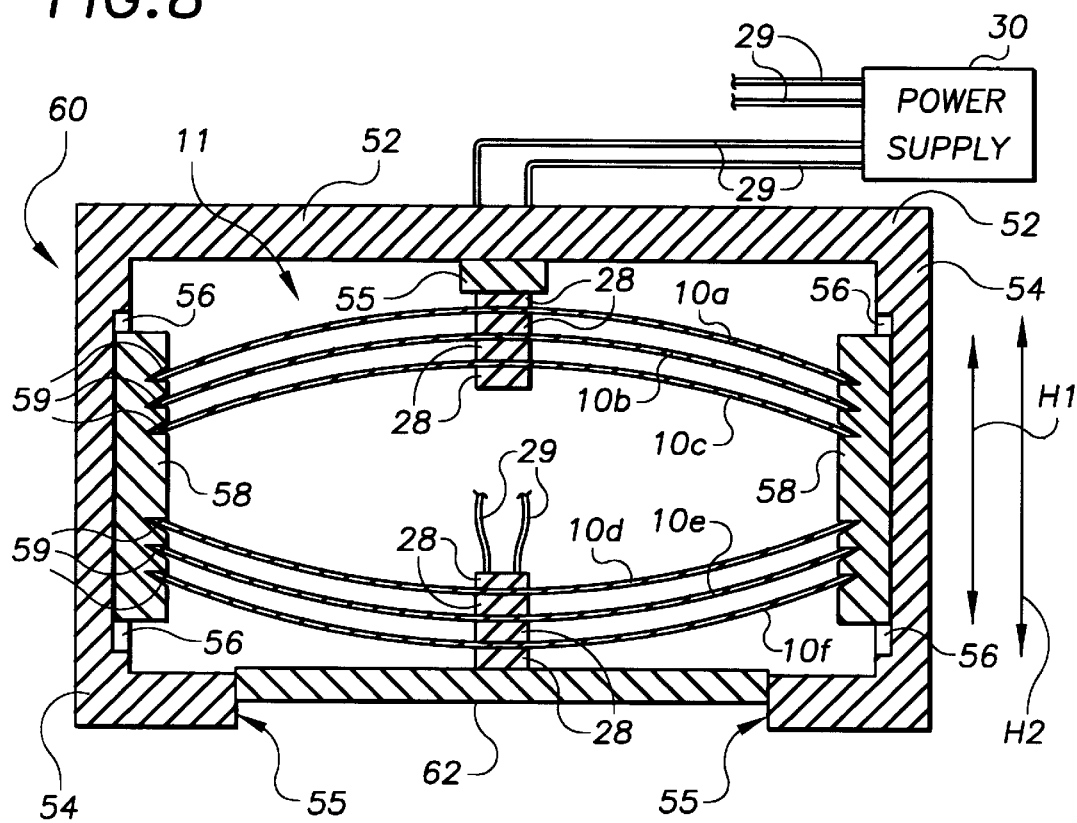
FIG. 8 is a cross-sectional elevation showing multiple transducers mounted in a clamshell configuration in a motor housing in accordance with the preferred embodiment of the present invention.

As shown in FIG. 8, in the preferred embodiment of the invention, three transducers 10a, 10b, and 10c are stacked between four electrical contact plates 28 in one direction, and three transducers 10d, 10e and 10f are stacked between four electrical contact plates 28 in an opposing direction to form a composite clamshell transducer 11 comprising six transducers 10a, 10b, 10c, 10d, 10e, and 10f.

For the purpose of following the present disclosure, terms such as "upper", "lower", "top", "bottom", "vertical", "height" and "sides" are used to describe the present invention with reference to the orientations depicted in the drawing figures. However, it should be understood for example, that the motor could face another direction, such that the "upper" part is not at the highest elevation, but may be at the lowest elevation or on a "side." Thus these terms are used merely to describe the relative positions of the disclosed components of the present invention with respect to each other as illustrated in the drawings and should not be interpreted to limit the scope of the invention.

Referring again to FIG. 8: The composite clamshell transducer 11 is housed within a motor housing 60 which has a side wall 54 and top wall 52. The upper part of the composite clamshell transducer 11 is attached to the top wall 52 of the motor housing 60. The uppermost transducer 10a of the composite clamshell transducer 11, or the top electrical contact plate 28 may be rigidly attached by screws, welding or other means (not shown) to the top wall 52 of the motor housing. A spacer 57 may be located between the top wall 52 of the motor housing 60 and the uppermost transducer 10a. The spacer 57 and the motor housing 60 are preferably constructed of nonconductive materials in order to prevent inadvertent shorting or grounding of the voltage applied to the individual transducers 10 of the composite clamshell transducer 11.

The motor housing 60 is also provided with recesses 56 in the side walls 54 of the housing which are adapted to receive sliding side mounts 58 for the composite clamshell transducer 11. The sliding side mounts 58 are preferably constructed of an electrically nonconductive material. The sliding side mounts 58 fit within the recesses 56 in the motor housing 60 such that the vertical surfaces of the sliding side mounts 58 are in sliding contact with the vertical surfaces of the recesses 56 in the motor housing 60. The height H1 of the sliding side mounts 58 is less than the height H2 of the recesses 56 in the motor housing 60. Thus, the heights H1 and H2 define a range of vertical motion (H2–H1) within which the sliding side mounts 58 may slide in the recesses 56 in the side walls 54 of the motor housing 60.

Figure 9:
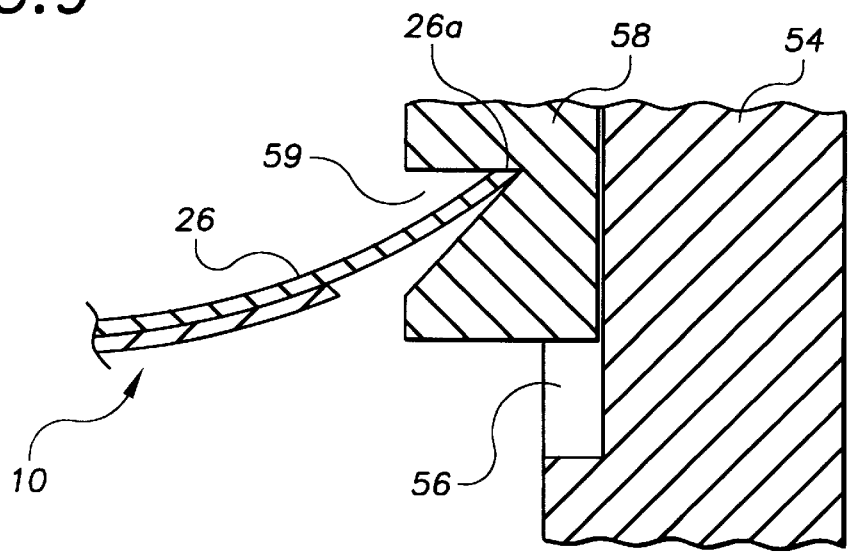
FIG. 9 is a partial cross-sectional side elevation of the transducer in FIG. 8, detailing of the edge of a transducer within a slotted sliding side mount.

Referring now to FIG. 9: The inward facing vertical surfaces of the sliding side mounts 58 contact the edges 26a of the individual transducers 10a–f of the composite clamshell transducer 11. Each sliding side mount 58 is provided with slots 59 which are adapted to receive an edge 26a of each transducer 10a–f in the composite clamshell transducer 11. In the preferred embodiment of the invention, two sliding side mounts 58 are on opposite sides of the motor housing 60, and each sliding side mount 28 has a straight slot 59 which receives a straight edge 26a of an arcuate rectangular transducer 10. It is within the scope of the present invention, however, to have a circular motor housing 60 with a circular sliding side mount 58 with slots 59 that receive the edge 26a corresponding to the outer circumference of a circular dome-shaped transducer 10. It is also within the scope of the present invention to use more than one sliding side mount 58 in a circular motor housing 60, with each sliding side mount 58 comprising a segment of the circle's circumference.

Figure 10:
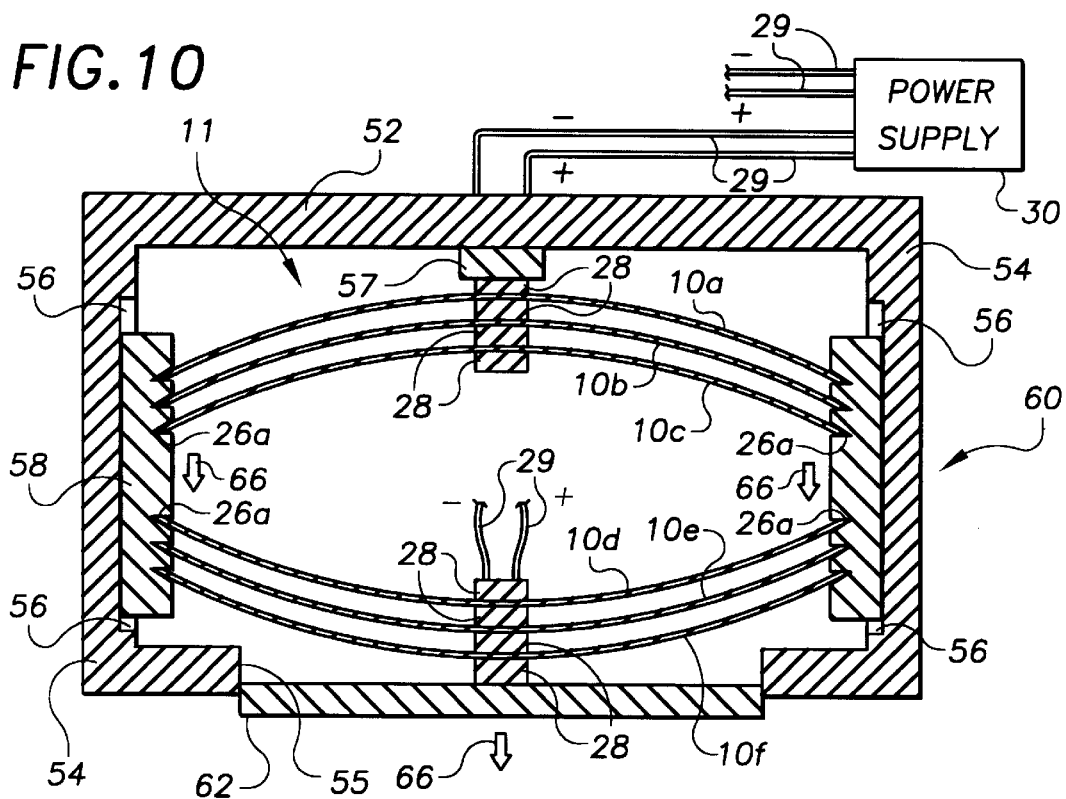
FIG. 10 is an cross-sectional elevation view of the invention in FIG. 8 in operation after application of a voltage to the transducers causes expansion of the clamshell and a resulting motion in the pressure plate.

Referring now to FIG. 10: When a voltage of a first polarity is applied (through the electrical contact plates 28) to each transducer 10a–f in the composite clamshell transducer 11, the transducers 10a–f deform, becoming more curved. The edges 26a of the transducers 10a, 10b and 10c in the upper part of the composite clamshell transducer 11 curve away from the top wall 52 of the motor housing 60 and the edges 26a of the transducers 10d, 10e and 10f in the lower part of the composite clamshell transducer 11 curve toward the top wall 52 of the motor housing 60. Because the uppermost transducer 10a in the composite clamshell transducer 10g is rigidly attached to the top surface 52 of the motor housing 60, the motion of the edges 26a of the deforming transducers 10a, 10b and 10c in the upper part of the clamshell 11 is directed downward (in the direction of arrows 66) from the top wall 52 of the motor housing 60. The curving of the edges 26a of the transducers 10d, 10e and 10f in the lower part of the composite clamshell transducer 11 toward the top wall 52 of the motor housing 60 causes the bottom of the lowermost transducer 10 to move away from the top wall 52 of the motor housing 60. Because the edges 26a of the transducers 10a–f are mounted within the slots 59 in the sliding side mounts 58, the motion of the transducers 10a, 10b and 10c in the upper part of the composite clamshell transducer 11 is translated through the sliding side mounts 58 into the transducers 10d, 10e and 10f in the lower part of the composite clamshell transducer 11. Thus, when a voltage of a first polarity is applied, the transducers 10a–f become more curved. The curving the upper transducers 10a–c causes the edges 26a of all of the transducers 10a–f and the sliding side mounts 58 to move downward away from the top wall 52 of the motor housing 60. The downward motion of the sliding side mounts 58 and the curving of the lower transducers 10d, 10e and 10f in the lower part of the composite clamshell transducer 11 translates into a lowering (in the direction of arrows 66) of the bottom surface of the lowermost transducer 10f.

Figure 11:
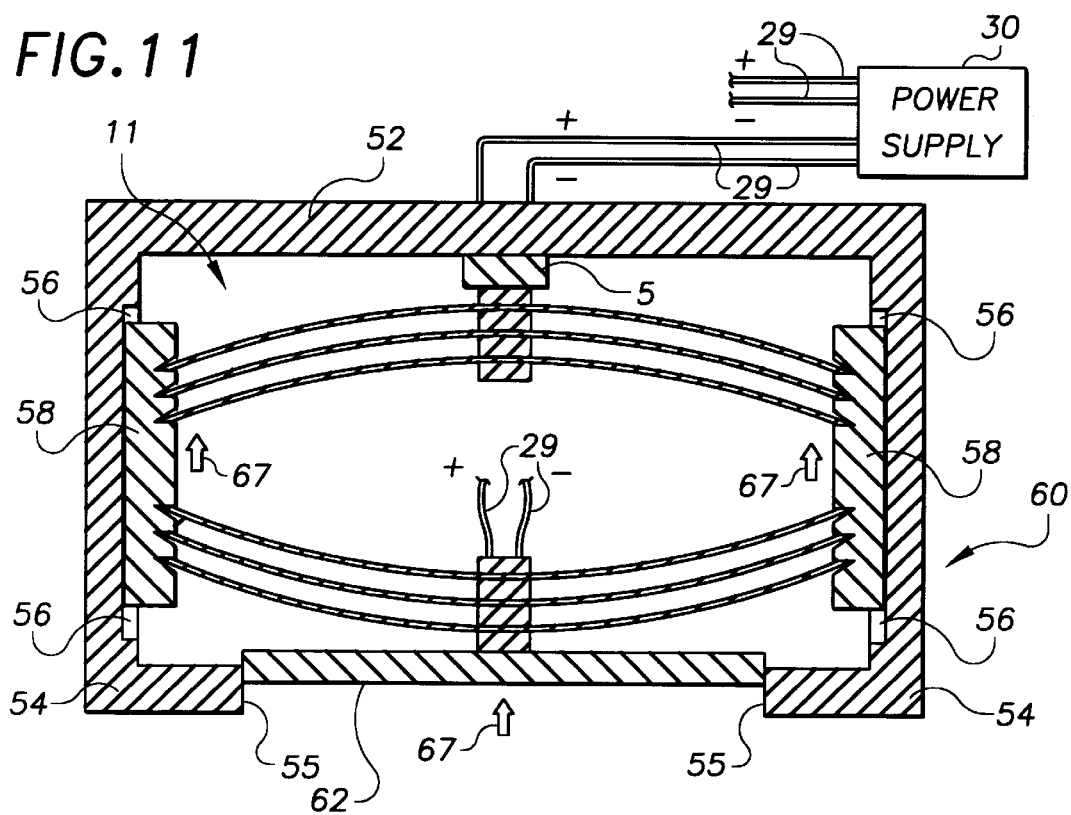
FIG. 11 is a cross-sectional elevation view of the invention in FIG. 8 in operation after application of an opposite voltage to the transducers causes contraction of the clamshell and a resulting motion in the pressure plate.

Referring now to FIG. 11: When a voltage of a second opposite polarity is applied (through the electrical contact plates 28) to each transducer 10a–f in the composite clamshell transducer 11, the transducers 10a–f again deform, becoming less curved. Because the uppermost transducer 10a in the composite clamshell transducer 10g is rigidly attached to the top wall 52 of the motor housing 60, the motion of the edges 26a of the deforming transducers 10a–f is directed toward (in the direction of arrow 67) the top wall 52 of the motor housing 60. The flattening of the edges 26a of the transducers 10d, 10e and 10f in the lower part of the composite clamshell transducer 11 causes the bottom of the lowermost transducer 10 to move toward from the top wall 52 of the motor housing 60. Because the edges 26a of the transducers 10a–f are mounted within the sliding side mounts 58, the motion of the edges 26a of the transducers 10a, 10b and 10c in the upper part of the composite clamshell transducer 11 is translated through the sliding side mounts 58 into the transducers 10d, 10e and 10f in the lower part of the composite clamshell transducer 11. Thus, when a voltage of a second (i.e., opposite) polarity is applied, the transducers 10a–f become more flat. The flattening of the upper transducers 10a–c causes the edges 26a of all of the transducers 10a–f and the sliding side mounts 58 to move upward toward the top wall 52 of the motor housing 60. The upward motion of the sliding side mounts 58 and the flattening of the lower transducers 10d, 10e and 10f in the lower part of the composite clamshell transducer 11 translates into a raising (in the direction of arrows 67) of the bottom surface of the lowermost transducer 10f toward the top wall 52 of the motor housing 60.

The lowermost transducer 10f in the lower part of the composite clamshell transducer 11 is attached to a pressure plate 62 which is preferably constructed of an electrically nonconductive material. The lowermost transducer 10f may be rigidly attached or pivotably attached to the pressure plate 62 by welding, screws, pins or other appropriate means (not shown). The pressure plate 62 is slidably disposed within a plate opening 55 in the motor housing 60, thereby allowing a free range of vertical motion (in the direction of arrows 66 and 67). Thus, when the composite clamshell transducer 11 deforms, lowering the bottom surface of the lowermost transducer 10f under one polarity, and raising the bottom surface of the lowermost transducer 10f under an opposite polarity, this deformation causes the attached pressure plate 62 to exhibit the same vertical range of motion as its attachment point on the bottom surface of the lowermost transducer 10f.

The pressure plate 62 may be attached to a shaft, lever, gearing, spring loaded pawls or other motion translating means (not shown) to translate the oscillating vertical motion of the pressure plate into oscillating motion in any plane or combination of planes, into direct linear motion, or into circular motion.

Figure 12:
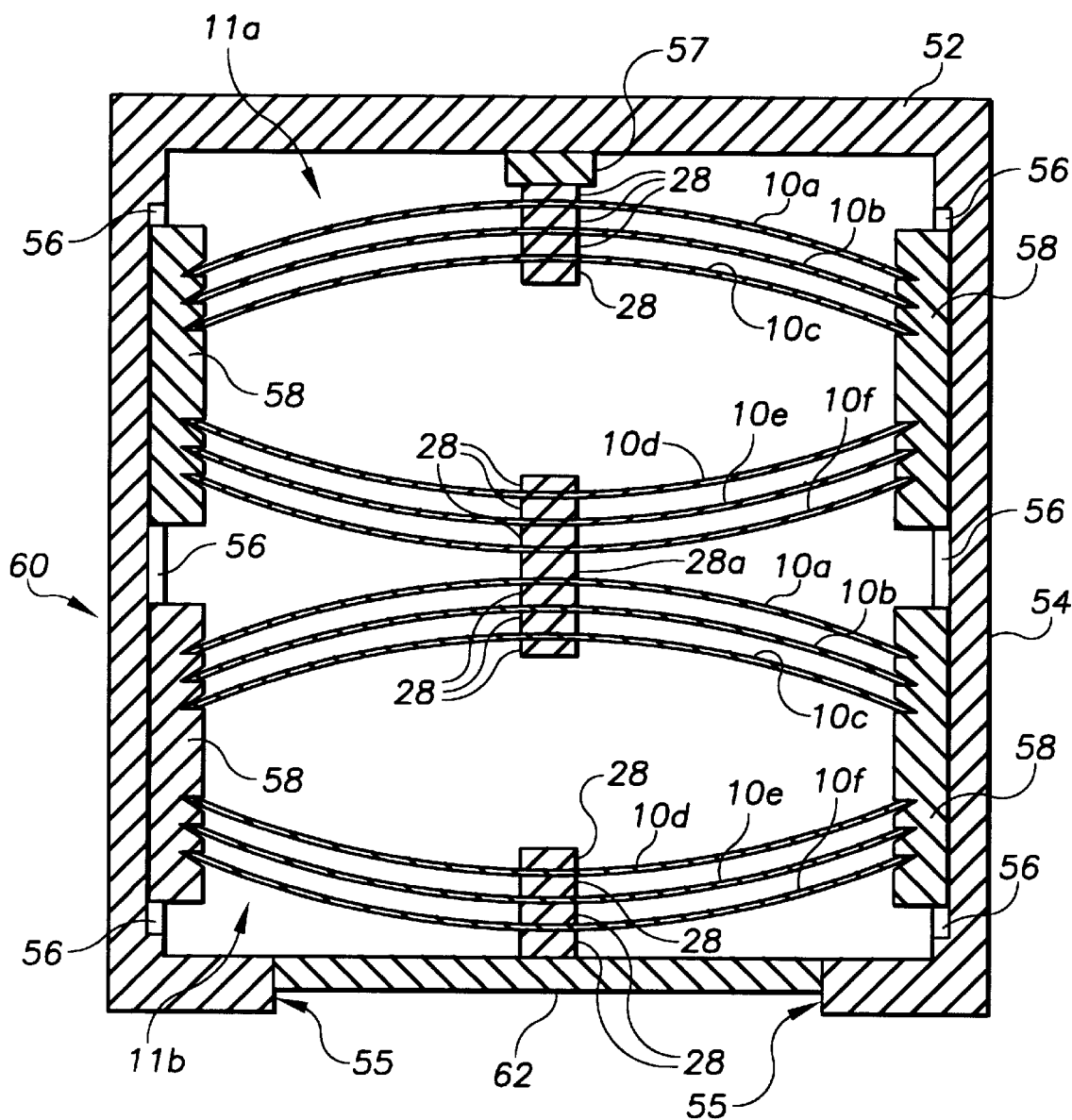
FIG. 12 is a cross-sectional elevation of an alternate embodiment of the present invention using two stacked composite clamshell transducers.

Referring now to FIG. 12: More than one composite clamshell transducer 11a and 11b may be disposed within a motor housing 60 by using multiple sliding side mounts 58 in the recesses 56. As illustrated in FIG. 12, a single continuous recess 56 may receive more than one sliding side mount 58. It is, however, within the scope of the present invention to provide individual recesses 56 for each sliding side mount 58.

The composite clamshell transducers 11a and 11b may be advantageously coupled to each other with an electrical contact plate 28. This allows the application of the same voltage across the lower transducers 10d, 10e and 10f of the first composite transducer 11a, and the upper transducers 10a, 10b and 10c of the second composite transducer 11b. It may be desirable for some applications to electrically isolate clamshell transducers 11a and 11b from each other. The composite transducers 11a and 11b may be isolated from each other using an electrically nonconductive spacer (not shown) in place of conductor 28a in order to apply a different voltage across each composite transducer 11a and 11b. By applying one polarity, phase and/or magnitude of voltage across a first composite transducer 11a, and applying another polarity, phase and/or magnitude of voltage across the other composite transducer 11b in stacked relation with the first composite transducer 11a, one may advantageously vary the displacement or force produced by the stacked transducers 11a and 11b. It will be appreciated by those skilled in the art that stacked composite transducers 11a and 11b of the embodiment of FIG. 12 can be used to produce a greater displacement than the embodiment of FIG. 8, while producing the same force.

Figure 13:
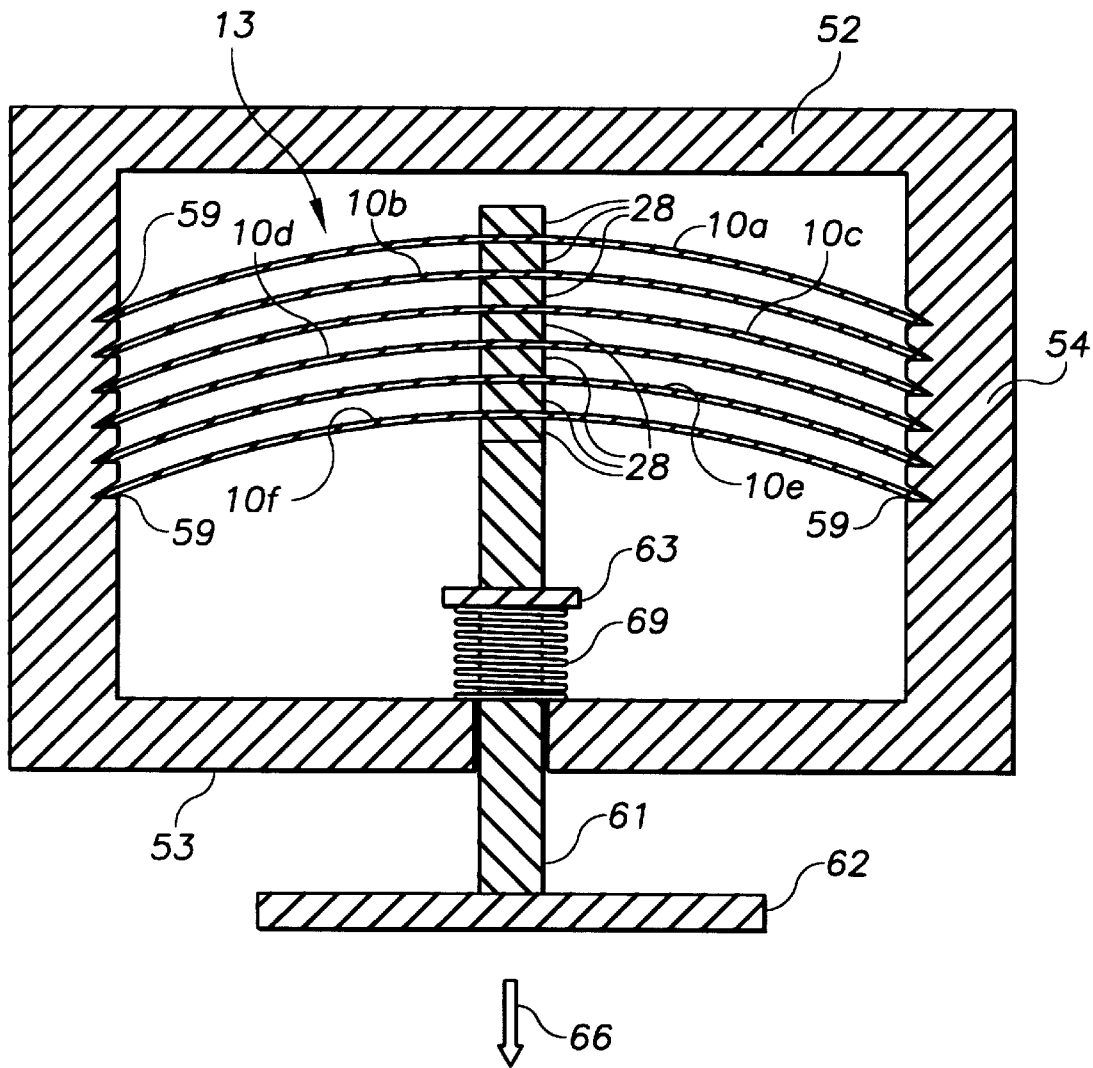
FIG. 13 is a cross-sectional elevation of an alternate embodiment of the present invention, where the transducers are stacked in parallel and without sliding side mounts.

Referring now to FIG. 13: In an alternate embodiment, a composite parallel stacked transducer 13 is manufactured by stacking individual transducers 10 in parallel (i.e., "nested") relation alternately between electrical contact plates 28. In this embodiment, sliding side mounts 58 are not necessary to translate the motion of the composite parallel stacked transducer 13 when a voltage is applied across it. The edges 26a of the individual transducers 10 in the composite parallel stacked transducer 13 may be mounted in slots 59 located in the side walls 54 of the motor housing 60. The composite parallel stacked transducer 13 may be coupled to a pressure plate 62 by a shaft 61 or other appropriate means. A composite parallel stacked transducer 13 produces the same displacement as a single transducer, but produces a greater force, which is the sum of the forces of the individual transducers in the composite parallel stacked transducer 13. Thus, the embodiment of the invention in FIG. 13 produces a higher force and less displacement than the embodiments of FIGS. 8 and 12.

In a curved prestressed piezoelectric transducer 10, the transducer 10 deforms becoming more curved under a voltage of one polarity, and deforms becoming less curved under a voltage of another (i.e., opposite) polarity. Starting from the transducer's 10 rest position (i.e., zero voltage) it has been observed that the transducer 10 exhibits a greater range of displacement under voltages that cause the transducer 10 to become less curved. Thus, a curved prestressed piezoelectric transducer 10 generates greater displacement under a voltage that flattens the transducer 10, than the transducer 10 does under a voltage that causes it to become more curved.

When mounting a composite parallel stacked transducer 13 composed of individual transducers 10 that displace more in the flattening direction, it is advantageous to spring mount the shaft 61 to which the composite parallel stacked transducer 13 is coupled. A spring mounting includes a retainer ring 63 rigidly fixed to the shaft 61, and a spring 69 located around the shaft 61 between the retainer ring 63 and the bottom wall 53 of the motor housing 60. The force of the spring 69 against the retainer ring 63 opposes the motion of the shaft as it moves downward in the direction of arrow 66, and helps return the shaft and the composite parallel stacked transducer 13 to its neutral position. A spring mounted transducer-shaft assembly allows the useful force and displacement to be translated to the pressure plate 62, and enables the composite parallel stacked transducer 13 to more quickly deform in the more curved direction. By aiding in the deformation of the composite parallel stacked transducer 13 in the more curved direction, the embodiment of FIG. 13 may be cycled at a higher frequency.

It will be appreciated by those skilled in the art that a piezoelectrically actuated motor using transducers incorporating a prestressed electroactive element and manufactured in accordance with the present invention may generate greater force and displacement than prior piezoelectric motors. The amount of force and displacement will depend on the electrical and mechanical properties of the materials of construction selected for the transducers as well as the applied voltage. Various configurations for the motor exist depending on the force and displacement requirements; opposed transducers (in a clamshell configuration) provide high displacement, whereas stacked parallel transducers provide high force and less displacement. In the preferred embodiment of the present invention, a combination of opposed and parallel stacked transducers generates both high force and displacement as compared to a single transducer. The composite transducer may then be coupled to appropriate means for translating the generated force and displacement, such means including sliding side mounts, pressure plates and shafts.

It will also be appreciated by those skilled in the art that a piezoelectrically actuated motor manufactured in accordance with the present invention has improved electrical contact to both sides of a piezoelectric transducer while providing a secure mechanical mounting. The electrical contact plates are more durable than prior methods of providing electrical contact because they are not as susceptible to fatigue as prior art soldered wires leads.

While the above description contains many specificities, these should not be construed as limitations on the scope of the invention, but rather as an exemplification of one preferred embodiment thereof. Many other variations are possible, for example:

The clamshell configuration of the transducers need not include six transducers but may include many more or as little as two transducers;

The transducers need not be mounted in a clamshell configuration; a single transducer or stack of non-opposing transducers may be used;

The transducer need not be rectangularly shaped, but may be circularly shaped or any variety of shapes;

More than one electrical contact plate may separate individual transducers in a composite clamshell transducer;

More than two sliding side mounts may be situated in the side walls of the motor housing to contact the edges of the transducers;

The pressure plate may be eliminated or replaced with other motion translating means Accordingly, the scope of the invention should be determined not by the embodiment illustrated, but by the appended claims and their legal equivalents.

I claim:

1. A device comprising:

A piezoelectric element, said piezoelectric element having first and second major surface facing in opposite directions from each other;

A first electrical contact plate being disposed adjacent said first major surface;

A second electrical contact plate being disposed adjacent said second major surface;

A housing having first and second interior sides substantially facing each other;

A first recess in said first interior side of said housing;

A second recess in said second interior side of said housing;

A first end of said piezoelectric element being disposed within said first recess;

A second end of said piezoelectric element being disposed within said second recess;

Said housing comprising a moveable piston member, said piston member being moveable with respect to said first and second sides of said housing;

And said moveable piston member being mechanically secured to said first electrical contact.

* * * * *